June 21, 1960 G. MURRAY 2,942,206
TRANSISTOR OSCILLATOR
Filed March 19, 1958
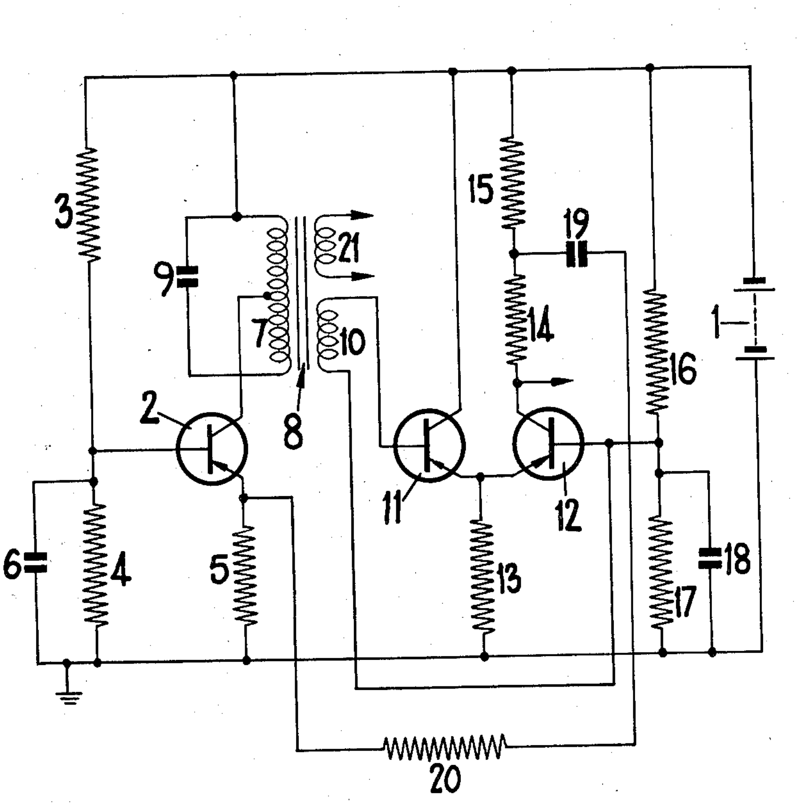
INVENTOR
GEORGE MURRAY
BY
ATTORNEYS 2,942,206

TRANSISTOR OSCILLATOR

George Murray, Wembley, England, assignor to The General Electric Company Limited, London, England Filed Mar. 19, 1958, Ser. No. 722,539

Claims priority, application Great Britain Mar. 25, 1957

3 Claims. (Cl. 331—117)

This invention relates to electric oscillators of the kind incorporating a transistor amplifier.

It is an object of the present invention to provide an electric oscillator of the kind specified having a relatively high degree of frequency stability.

According to the invention, in an electric oscillator of the kind specified the transistor amplifier has its output connected to a resonant frequency determining circuit and is arranged to operate as a substantially linear amplifier throughout the cycle of oscillation, and the amplitude of the oscillation is arranged to be limited by means of an amplitude limiting device provided in a regenerative feedback path which is connected between the resonant circuit and the input of the amplifier.

The invention is based upon the realisation that a major source of frequency instability in conventional electric oscillators of the kind specified arises because of the fact that the function of limiting the amplitude of the oscillation (which is necessary in any oscillator) is performed by the amplifier itself; this means that the amplifier necessarily operates in a non-linear manner over at least part of the cycle of oscillation, thereby rendering the oscillation frequency relatively sensitive to changes in the parameters of the transistor(s) in the amplifier, which may occur for example due to changes in the ambient temperature or the voltage of the power supply for the oscillator. By separating the functions of amplication and amplitude limiting, the present invention provides an arrangement in which the sensitivity of the oscillation frequency to factors such as those mentioned above is considerably reduced as compared with conventional electric oscillators of the kind specified.

Preferably, the frequency stability of an electric oscillator in accordance with the present invention is further improved by adopting one or more of the following measures. Firstly, the feedback path may be arranged to have a relatively high input impedance, so as to give rise to little damping of the resonant circuit. Secondly, the feedback path may be arranged to have a relatively high output impedance compared with the input impedance of the amplifier, so that variations of the input impedance of the amplifier have relatively little effect on the current flowing in the feedback path. Thirdly, the amplitude limiting device may be arranged to operate symmetrically on the positive and negative half cycles of the oscillation, so that no even harmonics are present in the signal fed to the input of the amplifier; by this means the frequency of oscillation is made relatively insensitive to variation of the amplitude of the signal derived from the resonant circuit, which may occur due to variation of the voltage of the power supply for the oscillator, since such variation of the amplitude of the signal derived from the resonant circuit will have relatively little effect on the harmonic content of the signal fed to the input of the amplifier. Fourthly, the resonant circuit may be arranged to be antiresonant at a frequency approximately three times the resonant frequency, so that the oscillation will have a relatively low third harmonic content.

A further advantage of an electric oscillator in accordance with the present invention is that it may be utilised to provide either an output signal of sinusoidal waveform, which may be derived from the resonant circuit, or an output signal of non-sinusoidal waveform, which may be derived from the output of the amplitude limiting device; in the latter case, the precise waveform of the output signal will be determined by the nature of the amplitude limiting device, which may for example be arranged so that the output waveform is substantially rectangular.

One arrangement in accordance with the invention will now be described by way of example with reference to the accompanying drawing, which is a circuit diagram of an electric oscillator designed to operate at a frequency of about 20 kilocycles per second.

The oscillator is arranged to be energised by a power supply 1 having a nominal voltage of six volts, the positive terminal of which is earthed. The oscillator incorporates a Class A transistor amplifier which utilises a single germanium P-N-P junction transistor 2 of type OC70, connected in the common base configuration. The direct current operating conditions of the transistor 2 are fixed by a conventional arrangement incorporating three resistors 3, 4 and 5. The resistor 3, which has a value of 4700 ohms, is connected between the base of the transistor 2 and the negative terminal of the power supply 1, and the resistors 4 and 5, each of which has a value of 1200 ohms, are respectively connected between the base and emitter of the transistor 2 and earth; the base of the transistor 2 is also connected to earth via a bypass capacitor 6 having a value of 2 microfarads. The values of the resistors 3 and 4 are such that the current flowing through them is much greater than the value of the collector leakage current ($I_{co}$) flowing in the transistor 2 at the highest temperature in the normal operating range of the oscillator, thus ensuring that the transistor 2 will not be driven into a non-linear mode of operation by increase of the collector leakage current with temperature.

The input signal for the amplifier is applied to the emitter of the transistor 2, as will be explained in more detail later, and the collector of the transistor 2 is connected to a tapping on the primary winding 7 of a step-down transformer 8 having a turns ratio of 3:1, one end of the winding 7 being connected to the negative terminal of the power supply 1. A capacitor 9 is connected across the winding 7 so as to form a parallel resonant circuit, the value of the capacitor 9 being chosen in relation to the inductance of the winding 7 so that the circuit is resonant at the desired frequency of oscillation; it will of course be appreciated that a variable capacitor can be used if it is desired to make the oscillator tunable. With the connections to the resonant circuit as described above, the circuit will be anti-resonant at some frequency above the resonant frequency, and by suitable choice of the position of the tapping on the winding 7 and the coupling coefficient between the sections of the winding 7 on either side of the tapping the circuit is arranged to be anti-resonant at a frequency approximately three times the resonant frequency. This requires that the quantity $9X^2(1-K^2)$ should be approximately equal to unity, where X is the fraction of the winding 7 disposed on the side of the tapping remote from the power supply 1 and K is the coupling coefficient between the two sections of the winding 7; for example if X is ⅔, K should be approximately 0.87.

In addition to ensuring that the oscillation will have a relatively low third harmonic content, the arrangement described has the advantages, as compared with a case in which the whole of the winding 7 is connected between the collector of the transistor 2 and the power supply 1, that there is less damping of the resonant circuit, the voltage swing in the resonant circuit may be greater without incurring the risk of driving the collector of the transistor 2 into a non-linear condition of operation, and the resonant frequency is less sensitive to changes of the so-called collector capacitance of the transistor 2 which may occur due to changes in the voltage of the power supply 1.

The oscillator also incorporates a regenerative feedback path, which includes the secondary winding 10 of the transformer 8 and an amplitude limiting circuit which utilises two germanium P-N-P junction transistors 11 and 12, each of type OC 71. The ends of the winding 10 are respectively connected to the bases of the transistors 11 and 12, and the emitters of the transistors 11 and 12 are connected together and to earth via a resistor 13 having a value of 3300 ohms. The collector of the transistor 11 is connected directly to the negative terminal of the power supply 1, while the collector of the transistor 12 is connected to the negative terminal of the power supply 1 via a load consisting of two resistors 14 and 15 in series, the resistor 14 having a value of 2700 ohms and the resistor 15 having a value of 470 ohms. The base of the transistor 12 is connected to the mid-point of a potentiometer constituted by two resistors 16 and 17, each of value 3300 ohms, connected in series across the power supply 1, and is also connected to earth via a bypass capacitor 18 having a value of 2 microfarads.

In operation of the oscillator, the voltage appearing across the winding 10 is of substantially sinusoidal waveform, having an amplitude of about one volt. The operation of the amplitude limiting circuit during one cycle of this voltage will now be described, commencing at an instant when the instantaneous value of the voltage across the winding 10 is zero and is changing in such a sense as to make the base of the transistor 11 negative with respect to the base of the transistor 12. At the instant mentioned, the bases of the transistors 11 and 12 are both negative with respect to earth by an amount equal to half the voltage of the power supply 1, and the emitters of the transistors 11 and 12 are negative with respect to earth by a slightly smaller amount, due to the flow of the emitter currents of the transistors 11 and 12 through the resistor 13; both the transistors 11 and 12 are therefore conducting, the collector currents being substantially the same despite the fact that the collector voltage of the transistor 12 is somewhat less negative than the collector voltage of the transistor 11. As the cycle of oscillation proceeds from the instant mentioned, the base of the transistor 11 is driven negative with respect to the base of the transistor 12, and the emitter current of the transistor 11 therefore increases, consequently driving the emitters of the transistors 11 and 12 more negative. When the instantaneous value of the voltage appearing across the winding 10 reaches about 0.2 volt, the emitters of the transistors 11 and 12 have been driven sufficiently negative to bring about cut-off of the transistor 12, and the transistor 12 remains cut off until the instantaneous value of the voltage across the winding 10 returns to 0.2 volt in the same half cycle of oscillation; the transistor 12 is thus cut off during the major part of this half cycle. In the cut-off condition, no emitter current flows in the transistor 12, and therefore only the collector leakage current flows through the load constituted by the resistors 14 and 15; in this condition, therefore, the collector of the transistor 12 is substantially at the voltage of the negative terminal of the power supply 1. At the end of the period during which the transistor 12 is cut off, the amplitude limiting circuit passes rapidly through a condition in which both transistors 11 and 12 are conducting, the collector and emitter currents of the transistor 11 decreasing and the collector and emitter currents of the transistor 12 increasing; when the instantaneous value of the voltage across the winding 10 reaches a point such that the base of the transistor 11 is about 0.2 volt positive with respect to the base of the transistor 12, the voltage between the emitter and base of the transistor 11 becomes zero and the transistor 11 is cut off; the transistor 11 remains cut off until the instantaneous value of the voltage across the winding 10 returns to 0.2 volt during the same half cycle, so that the transistor 11 remains cut off during the major part of this half cycle. While the transistor 11 is cut off, the emitter voltage of the transistor 12 remains substantially constant, so that a substantially constant current flows through the load constituted by the resistors 14 and 15; the values of the circuit components associated with the transistor 12 are such that as the transistor 11 reaches the cut-off condition the transistor 12 just reaches the bottomed condition, that is a condition in which the input current is so great that further increase of this current has substantially no effect on the value of the collector current. In the bottomed condition, the collector voltage of the transistor 12 is substantially the same as its base voltage, that is negative with respect to earth by an amount equal to half the voltage of the power supply 1. At the end of the period during which the transistor 11 is cut off, the amplitude limiting circuit reverts to a condition in which both the transistors 11 and 12 are conducting, the emitter and collector currents of the transistor 11 increasing and the emitter and collector currents of the transistor 12 decreasing.

It will be seen from the foregoing description that there is developed across the resistors 14 and 15, a voltage of substantially symmetrical rectangular waveform having a fundamental frequency equal to that of the sinusoidal voltage appearing across the winding 10 and having an amplitude of about 1.5 volts. The amplitude and waveform of this voltage are relatively insensitive to variations of ambient temperature and of the amplitude of the voltage appearing across the winding 10.

The effective impedance thrown across the resonant circuit by the input of the amplitude limiting circuit is relatively high, for the following reasons. During the period when the transistor 12 is cut off, the input impedance of the amplitude limiting circuit is relatively high since the transistor 11 is operating as an emitter follower having a load of 3300 ohms. During the period when the transistor 11 is cut off, the input impedance is high since it is effectively constituted by the impedances of two reverse biassed junction diodes (emitter/base and collector/base diodes of the transistor 11) connected in parallel. During the short periods when both the transistors 11 and 12 are conducting, the input impedance is somewhat lower, since the transistor 11 is operating as an emitter follower whose load consists of a 3300 ohm resistor shunted by the emitter input resistance of the transistor 12, which varies with variation of the emitter current in the transistor 12; the value of the resistor 13 is chosen so that the average emitter current in the transistor 12 during these periods is kept as low as possible, so as to keep the input impedance as high as possible.

The regenerative feedback path is completed by a coupling capacitor 19 having a value of 0.1 microfarad and a resistor 20 having a value of 2200 ohms, which are connected in series in the order stated between the junction between the resistors 14 and 15 and the emitter of the transistor 2. The signal appearing across the resistor 15 is thus fed via these components to the input of the amplifier, and since the alternating current input impedance of the amplifier has a value of about 20 ohms, the feedback path serves substantially as a constant current generator with respect to the amplifier. It will be appreciated that the feedback path is made regenerative by suitable choice of the polarities of the windings 7 and 10 of the transformer 8; this requires that the windings 7 and 10 should be arranged so that during the half cycles of oscillation when the collector of the transistor 2 swings more positive the base of the transistor 11 is driven positive with respect to the base of the transistor 12.

A sinusoidal output signal can be derived from the oscillator by way of a tertiary winding 21 on the transformer 8, and an output signal of substantially rectangular waveform can be derived from the collector of the transistor 12.

The frequency stability of the oscillator described may be illustrated by the following practical results. The components of the oscillator, other than the transformer 8 and its associated capacitor 9, were maintained in an enclosure of controlled temperature, and when this temperature was varied from 25° C. to 65° C. the oscillation frequency decreased by only 0.12%. At a constant temperature, the oscillation frequency decreased by only 0.04% when the supply voltage was increased from 6 volts to 18 volts.

If desired, a crystal controlled oscillator similar to the oscillator described above may be produced by connecting a piezoelectric crystal in the feedback path in series with the resistor 20. Alternatively, the capacitor 9 in the resonant circuit may be chosen in known manner so as to provide some degree of temperature compensation for the variation with temperature of the inductance of the winding 7.

In a further alternative, the oscillator described above may be adapted for synchronisation by removing the bypass capacitor 6 and applying synchronising pulses to the base of the transistor 2.

I claim:

1. An electric oscillator comprising a linear transistor amplifier, a resonant frequency determining circuit connected to the output of the amplifier, and a regenerative feedback path connected between the resonant circuit and the input of the amplifier and including an amplitude limiting device which comprises: a pair of transistors each having an emitter, a collector and a base, the emitters of the transistors being connected together and the collector of one of the transistors being connected to a first point which is arranged to be maintained in operation at a first fixed potential; a resistive load connected between the collector of the second transistor and said first point; a resistance connected between the emitters and a second point which is arranged to be maintained in operation at a second fixed potential which differs from said first fixed potential in a sense such that collector currents will flow in the normal direction in the transistors; means for maintaining the base of the second transistor in operation at a fixed potential intermediate said first and second fixed potentials; and a capacitance connected between the base of the second transistor and said second point; said feedback path further including means for applying between the bases of the two transistors in the amplitude limiting device a signal derived from the resonant circuit; and means for applying to the input of the amplifier a signal derived from said resistive load.

2. An electric oscillator as set forth in claim 1 wherein there further is included an impedance which is high compared with the input impedance of the amplifier, said further impedance being connected in circuit to couple the resistive load to the input of the amplifier.

3. An electric oscillator as set forth in claim 1 in which the resonant circuit comprises a capacitance connected in parallel with an inductance, and is connected to the output of the amplifier through terminals situated respectively at one end of, and intermediate along the length of, the inductance, the quantity of $9X^2(1-K^2)$ being approximately equal to unity, where X is the value of that fraction of the inductance which is not disposed between said terminals and K is the coupling coefficient between said fraction and the remainder of the inductance.

References Cited in the file of this patent

UNITED STATES PATENTS

| | | |
|---|---|---|
| 2,379,694 | Edson | July 3, 1945 |
| 2,794,124 | Purington | May 28, 1957 |
| 2,851,604 | Clapper | Sept. 9, 1958 |